United States Patent
Szymanski (10) Patent No.: US 11,003,206 B1
(45) Date of Patent: May 11, 2021

(54) FIELD-PROGRAMMABLE GATE ARRAY PRECISION INPUT TIMING

(71) Applicant: Rockwell Collins, Inc., Cedar Rapids, IA (US)

(72) Inventor: Anthony Szymanski, Lucas, TX (US)

(73) Assignee: Rockwell Collins, Inc., Cedar Rapids, IA (US)

(*) Notice: Subject to any disclaimer, the term of this patent is extended or adjusted under 35 U.S.C. 154(b) by 21 days.

(21) Appl. No.: 16/733,912

(22) Filed: Jan. 3, 2020

(51) Int. Cl.
*G06F 1/12* (2006.01)
*G06F 1/08* (2006.01)
*G06F 9/38* (2018.01)

(52) U.S. Cl.
CPC ............... *G06F 1/12* (2013.01); *G06F 1/08* (2013.01); *G06F 9/3869* (2013.01)

(58) Field of Classification Search
CPC ............. G06F 1/12; G06F 1/08; G06F 9/3869
See application file for complete search history.

(56) References Cited

U.S. PATENT DOCUMENTS

| | | | |
|---|---|---|---|
| 5,386,582 A | 1/1995 | Ebert | |
| 6,480,512 B1* | 11/2002 | Ahn | H04L 25/05 370/545 |
| 7,236,153 B1* | 6/2007 | Nakamura | G09G 3/30 345/98 |
| 7,885,320 B1 | 2/2011 | Groen et al. | |
| 8,261,160 B1* | 9/2012 | Nykter | G06F 11/0763 714/775 |
| 8,594,264 B1* | 11/2013 | Zhu | H03L 7/085 375/371 |
| 9,116,561 B2 | 8/2015 | Morris et al. | |
| 2019/0140647 A1 | 5/2019 | Lim et al. | |

FOREIGN PATENT DOCUMENTS

| | | |
|---|---|---|
| CN | 105827222 A | 8/2016 |
| CN | 106021025 A | 10/2016 |
| CN | 107465965 A | 12/2017 |
| CN | 108173733 A | 6/2018 |
| CN | 109254941 A | 1/2019 |
| KR | 101991052 B1 | 6/2019 |

* cited by examiner

*Primary Examiner* — Stefan Stoynov
(74) *Attorney, Agent, or Firm* — Suiter Swantz pc llo (57) ABSTRACT

A system may include a field-programmable gate array (FPGA). The FPGA may be configured to: determine a time corresponding to in which of x time periods a signal arrived at an input serializer based at least on a value; and determine a time when the signal arrived at an input pad based at least on a shift register latency value and the time corresponding to in which of the x time periods the signal arrived at the input serializer based at least on the value.

15 Claims, 8 Drawing Sheets

| BINARY VALUE (LONG PULSE) | BINARY VALUE (SHORT PULSE) | DATA VALUE (LONG PULSE) | 125 Mhz DELAY (ns) | TOTAL DELAY(ns) 125 Mhz DELAY + LATENCY |
|---|---|---|---|---|
| 10000000 | 10000000 | 0x80 | 0 | 8 |
| 11000000 | X1000000 | 0xC0 | 1 | 9 |
| 11100000 | XX100000 | 0xE0 | 2 | 10 |
| 11110000 | XXX10000 | 0xF0 | 3 | 11 |
| 11111000 | XXXX1000 | 0xF8 | 4 | 12 |
| 11111100 | XXXXX100 | 0xFC | 5 | 13 |
| 11111110 | XXXXXX10 | 0xFE | 6 | 14 |
| 11111111 | XXXXXXX1 | 0xFF | 7 | 15 |

FIG. 7

FIG.8

FIELD-PROGRAMMABLE GATE ARRAY PRECISION INPUT TIMING

BACKGROUND

When processing signals in the environment for intelligence gathering, timestamping of the signals is an important part of characterizing signals and determining location. When running a single system with a common time source this timing is relatively easy to maintain. As the trend in systems moves to low cost multi-platform systems maintaining time synchronization between systems becomes more difficult. Many systems rely on global positioning system (GPS) strobes and clocks to maintain time synchronization but are limited by the downstream sample clocks used to sample the input pins of field-programmable gate arrays (FPGAs) resulting in ambiguities which can be close to 10 nanoseconds (ns).

SUMMARY

In one aspect, embodiments of the inventive concepts disclosed herein are directed to a system. The system may include a field-programmable gate array (FPGA). The FPGA may include an input pad configured to receive a signal, an input serializer, and an x-bit wide shift register. The input serializer may include x serializer shift registers, wherein x is an integer greater than or equal to 2. The input serializer may be configured to receive the signal, wherein the signal passes through each serializer shift register in series. The input serializer may be configured to output parallel data indicative of the signal. Each serializer shift register may have a time period of a serializer clock of the input serializer. The input serializer may take x time periods to complete output of the parallel data. The x-bit wide shift register may be communicatively coupled to the input serializer. The x-bit wide shift register may be configured to receive the parallel data from the input serializer. The x-bit wide shift register may be sampled at a shift register clock to provide a value with each bit shift of the value corresponding to one of the x time periods for the parallel data. A speed of the shift register clock may be less than a speed of the serializer clock. The x-bit wide shift register may have a shift register latency value indicative of an amount of time for the signal to travel from the input pad through the x-bit wide shift register. The FPGA may be configured to: determine a time corresponding to in which of the x time periods the signal arrived at the input serializer based at least on the value; and determine a time when the signal arrived at the input pad based at least on the shift register latency value and the time corresponding to in which of the x time periods the signal arrived at the input serializer based at least on the value.

In a further aspect, embodiments of the inventive concepts disclosed herein are directed to a method. The method may include receiving a signal by an input pad of a field-programmable gate array (FPGA). The method may further include receiving the signal by an input serializer of the FPGA, the input serializer comprising x serializer shift registers, wherein x is an integer greater than or equal to 2, wherein the signal passes through each serializer shift register in series. The method may further include outputting, by the input serializer, parallel data indicative of the signal, wherein each serializer shift register has a time period of a serializer clock of the input serializer, wherein the input serializer takes x time periods to complete output of the parallel data. The method may further include receiving, by an x-bit wide shift register of the FPGA, the parallel data from the input serializer, the x-bit wide shift register communicatively coupled to the input serializer, wherein the x-bit wide shift register is sampled at a shift register clock to provide a value with each bit shift of the value corresponding to one of the x time periods for the parallel data, wherein a speed of the shift register clock is less than a speed of the serializer clock, wherein the x-bit wide shift register has a shift register latency value indicative of an amount of time for the signal to travel from the input pad through the x-bit wide shift register. The method may further include determining, by the FPGA, a time corresponding to in which of the x time periods the signal arrived at the input serializer based at least on the value. The method may further include determining, by the FPGA, a time when the signal arrived at the input pad based at least on the shift register latency value and the time corresponding to in which of the x time periods the signal arrived at the input serializer based at least on the value.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a method and a system including an FPGA configured to determine a time when a signal arrived at an input pad of the FPGA. As moving towards smaller independent systems becomes more prevalent, maintaining timing between two systems may be important for signal characterization and location. Maintaining precision timing may also provide accurate time stamping for post processing and analysis.

Inputs and outputs (IO) on FPGAs may be capable of sampling at close to 2 billion samples per second on modern FPGAs utilizing input double data rate (DDR) registers and input serialization and deserialization registers. FPGAs may contain shift registers just behind IO pins to allow for sampling of general purpose IO into the gigahertz (GHz) ranges. In some embodiments, by going to a x4 or x8 serialization input a design can sample an input pad (e.g., an input pin or input ball) at sample rates exceeding 1 billion samples per second. In some embodiments, by using IO resources that can be in the gigabit per second sample rates, it may be possible to time an input signal edge with accuracies within 1 ns. Some embodiments may include any suitable FPGA, such as a Xilinx Ultrascale FPGA or an Intel FPGA. Some embodiments may utilize input deserializers in parallel to provide high speed data interfaces between FPGAs or external peripherals such as DDR4 synchronous dynamic random access memory (SDRAM). Such IO resources can be utilized on a single input pin to provide a precise time of arrival of the signal at the pin.

Figure 1:
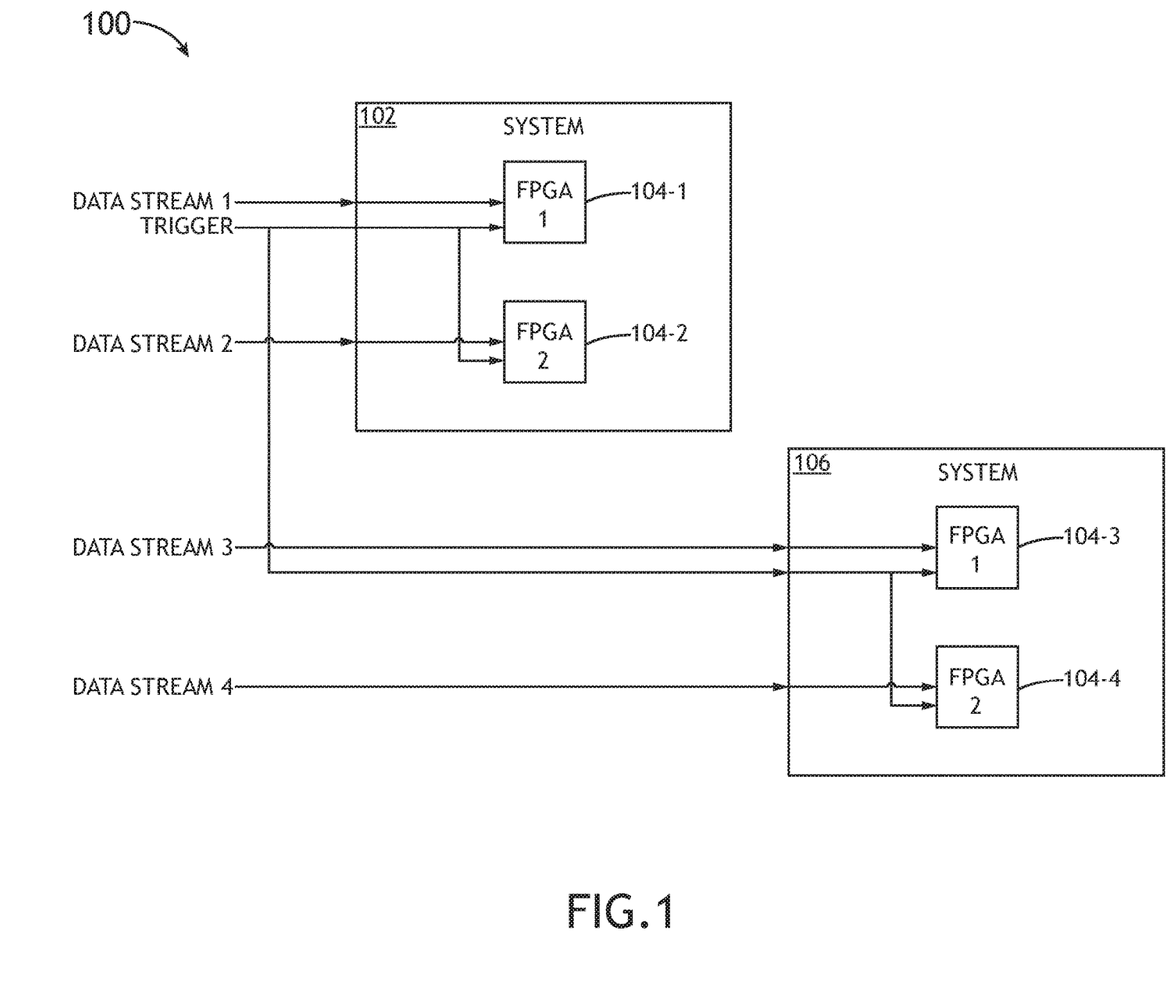
FIG. 1 is a view of an exemplary embodiment of a system according to the inventive concepts disclosed herein.

Referring now to FIGS. 1-4, an exemplary embodiment of a system 100 according to the inventive concepts disclosed herein is depicted. The system 100 may be implemented as any suitable system, such as a multiple vehicle system (e.g., at least one aircraft, at least one watercraft, at least one submersible craft, at least one automobile, and/or at least one train), a multiple FPGA system, and/or a multiple computing device system. For example, as shown in FIG. 1, the system 100 may include a system 102 and a system 106.

In some embodiments, the system 102 may be at least one computing device and/or a vehicle including at least one computing device. For example, the system 102 may include two FPGAs 104-1, 104-2, though the system 102 may include any suitable number of FPGAs.

In some embodiments, the system 106 may be at least one computing device and/or a vehicle including at least one computing device. For example, the system 106 may include two FPGAs 104-3, 104-4, though the system 106 may include any suitable number of FPGAs.

The first FPGA 104-1 may be configured to receive a first data stream. The second FPGA 104-2 may be configured to receive a second data stream. The third FPGA 104-3 may be configured to receive a third data stream. The fourth FPGA 104-4 may be configured to receive a fourth data stream. Each of the FPGAs 104-1, 104-2, 104-3, 104-4 may also be configured to receive a signal (e.g., a trigger signal or a GPS strobe). Each of the FPGAs 104-1, 104-2, 104-3, 104-4 may be configured to determine a time when the signal arrived at the input pad 202 of the particular FPGA. For example, each FPGA 104-1, 104-2, 104-3, 104-4 may be configured for: timestamping data with the time when the signal arrived at the input pad 202; utilizing the time when the signal arrived at the input pad 202 to perform data alignment; and/or utilizing the time when the signal arrived at the input pad 202 to perform clock synchronization operations. Some embodiments may be configured to maintain precise time synchronization across multiple FPGAs or systems. Some embodiments may be configured to increase accuracy in timestamping of collected data for post processing multiple systems. Some embodiments may allow for precision triggering to be better aligned to the trigger. Some embodiments may allow for data alignment across multiple inputs (e.g., of a single chip, of multiple chips, or of multiple systems).

Figure 2:
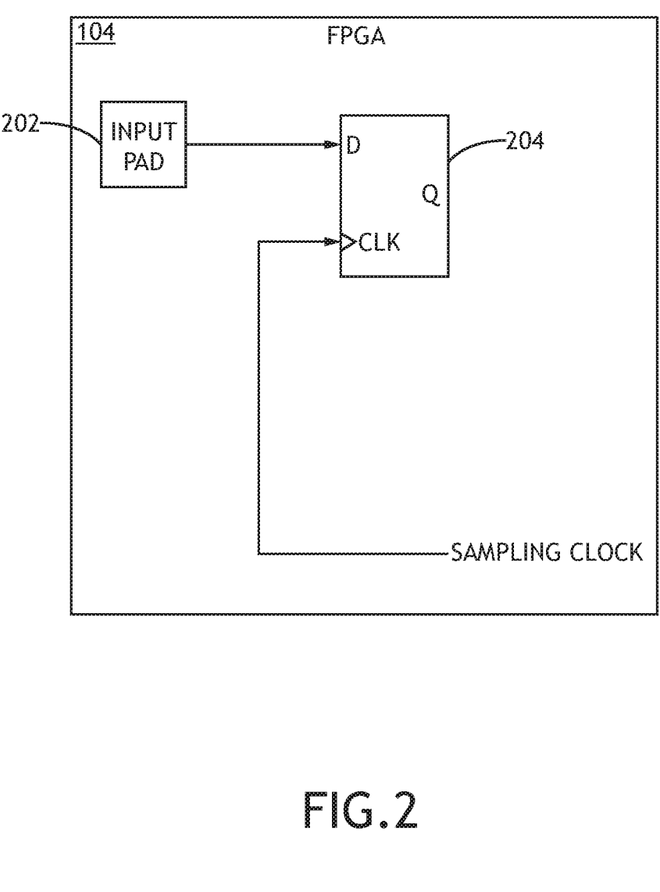
FIG. 2 is a view of a portion of one of the FPGAs of FIG. 1 according to the inventive concepts disclosed herein.
Figure 3:
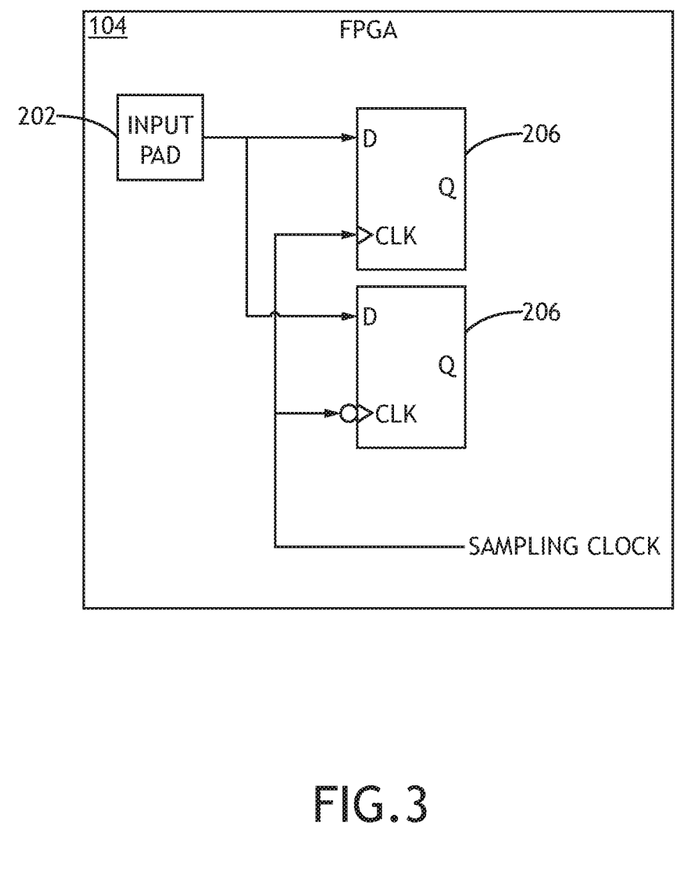
FIG. 3 is a view of a portion of one of the FPGAs of FIG. 1 according to the inventive concepts disclosed herein.
Figure 4:
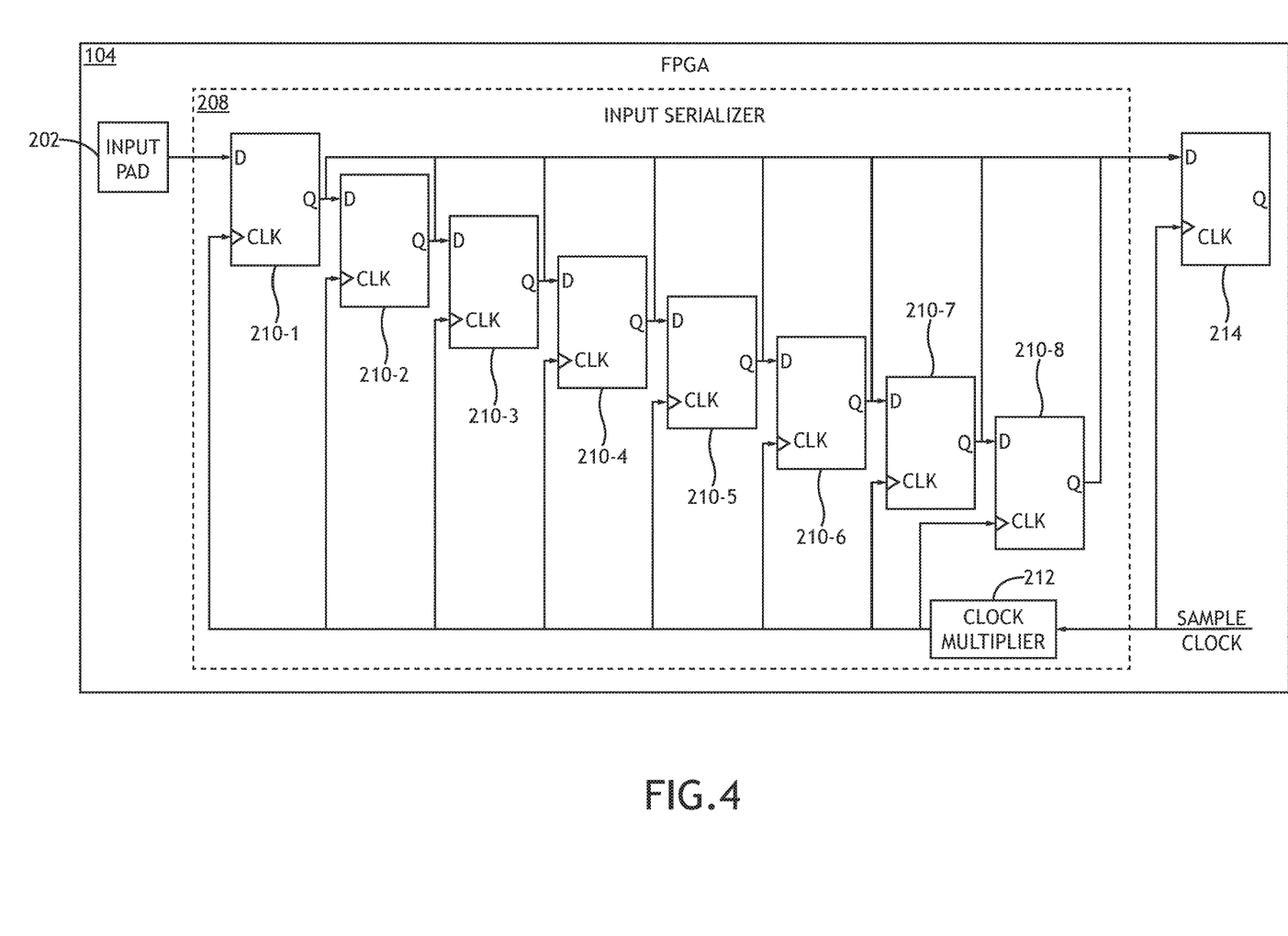
FIG. 4 is a view of a portion of one of the FPGAs of FIG. 1 according to the inventive concepts disclosed herein.

Referring now to FIGS. 2-4, each FPGA 104 may include at least one input pad 202 (e.g., an input pin or an input ball), at least one input register 204, at least two DDR registers 206, at least one input serializer 208, and/or at least one x-bit wide shift register (e.g., input deserializer 214).

The input pad 202 may be configured to connect to a circuit card assembly (e.g., a printed circuit board (PCB)) and to receive a signal (e.g., a trigger signal or a GPS strobe).

The input register 204 may be located in the FPGA 104 directly behind the input pad 202. In some embodiments, the input register may have a maximum sample rate of approximately 300 megahertz (MHz), though any suitable sample rate may be used.

The DDR registers 206 may be a set of two registers sampling on opposite edges of a sample clock to improve data rates to twice the sample clock of the input register. For example, the DDR registers 206 may have a sample rate of approximately 600 MHz, though any suitable sample rate may be used.

The input serializer 208 may include a clock multiplier 212 and a plurality of shift registers 210-1, 210-2, 210-3, 210-4, 210-5, 210-6, 210-7, 210-8 that may be able to sample at rates many times the sample clock rate of the input register 204. For example, the input serializer 208 may be configured to sample at approximately 1.8 GHz, though any suitable sample rate may be used. The input serializer 208 may include x serializer shift registers 210, wherein x is an integer greater than or equal to 2. For example, x may be 8 or 16, though any suitable number greater than 2 may be used. The input serializer 208 may be configured to receive the signal, wherein the signal may pass through each serializer shift register 210 in series. The input serializer 208 may be configured to output parallel data (e.g., an x-bit serial data word) indicative of the signal. Each serializer shift register 210 may have a time period of a serializer clock of the input serializer 208, wherein the input serializer 208 may take x time periods to complete output of the parallel data.

The x-bit wide shift register (e.g., input deserializer 214) may be coupled to the input serializer 208. The x-bit wide shift register may be configured to receive the parallel data (e.g., an x-bit serial data word) from the input serializer 208. The x-bit wide shift register may be sampled at a shift register clock to provide a value with each bit shift of the value corresponding to one of the x time periods for the parallel data. A speed of the shift register clock may be less than a speed of the serializer clock. The x-bit wide shift register may have a shift register latency value indicative of an amount of time for the signal to travel from the input pad 202 through the x-bit wide shift register.

The FPGA 104 may be configured to: determine a time corresponding to in which of the x time periods the signal arrived at the input serializer 208 based at least on the value; and determine a time when the signal arrived at the input pad 202 by subtracting from the current time a sum of the shift register latency value and the time corresponding to in which of the x time periods the signal arrived at the input serializer 208 based on the value. For example, the FPGA 104 may be further configured to determine the time corresponding to in which of the x time periods the signal arrived at the input serializer 208 based at least on a position of a first non-zero in the value in the case of an active high input, or position of a first zero in the case of an active low input. In some embodiments, the determined time when the signal arrived at the input pad 202 may be accurate to within the time period of the serializer clock of the input serializer 208. Some embodiments may include a second FPGA 104, wherein the second FPGA 104 may be configured to receive the signal and determine a time when the signal arrived at the second FPGA input pad 202, wherein the FPGA 104 and the second FPGA 104 may be configured to be synchronized by utilizing the time when the signal arrived at the input pad 202 and the time when the signal arrived at the second FPGA input pad 202. Some embodiments may include a first computing device including the FPGA 104 and second computing device including a second FPGA 104, wherein the second FPGA 104 may be configured to receive the signal and determine a time when the signal arrived at the second FPGA input pad 202, wherein the FPGA 104 and the second FPGA 104 may be configured to be synchronized by utilizing the time when the signal arrived at the input pad 202 and the time when the signal arrived at the second FPGA input pad 202.

Figure 5:
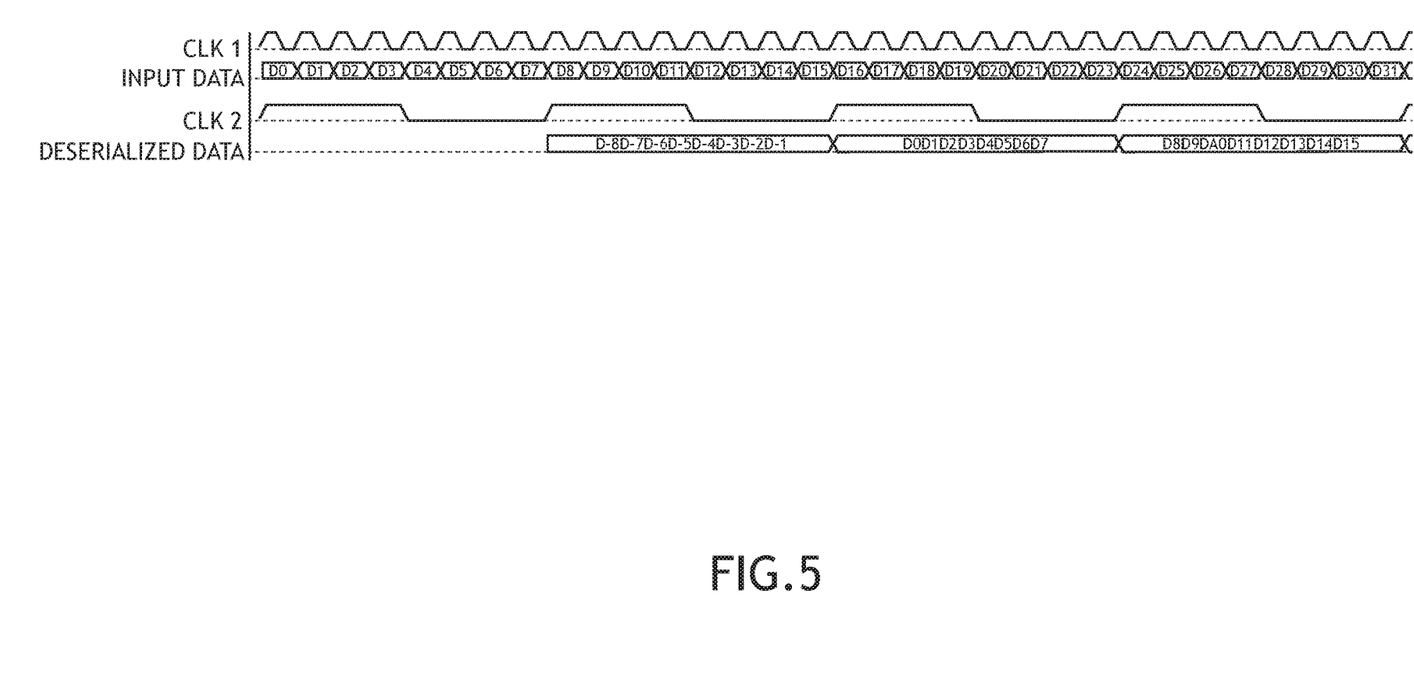
FIG. 5 is an exemplary graph illustrating a function of the input deserializer of an exemplary embodiment according to the inventive concepts disclosed herein.

Referring now to FIG. 5, an exemplary graph illustrating a function of the input deserializer 214 of an exemplary embodiment according to the inventive concepts disclosed herein is depicted. The input pad 202 may be sampled using a high-speed clock. For example, the high-speed sample clock may be set to 1 GHz giving a 1 ns clock period, though any suitable clock may be used. For example, the deserialized output may be provided at a clock rate of 1/8 the input sample clock with an 8-bit wide serial data word at 125 MHz, though any suitable x-bit wide serial data word may be used at a clock rate of 1/x of the input sample clock. For example, dealing with data at the lower clock rate may greatly ease any difficulties in meeting timing constraints on the system. While this is typically used to receive high speed data, the serial data word can also provide a precise time of arrival of the input signal at the input pad 202. The timing diagram includes latency through the deserializer 214 processing. In this example, the delay is assumed to be 8 ns or one 125 MHz clock. As the input is sampled at the 1 GHz clock, bits may be driven high in the case of an active high input or driven low in the case of an active low input based on when the input is first seen. Depending on which bits are active in the deserialized word it can be determined when in the 125 MHz clock period the input arrived. Combined with the latency of the deserializer 214 this can be used to give a time of arrival that is accurate to within a nanosecond of the signal's arrival.

Figure 6:
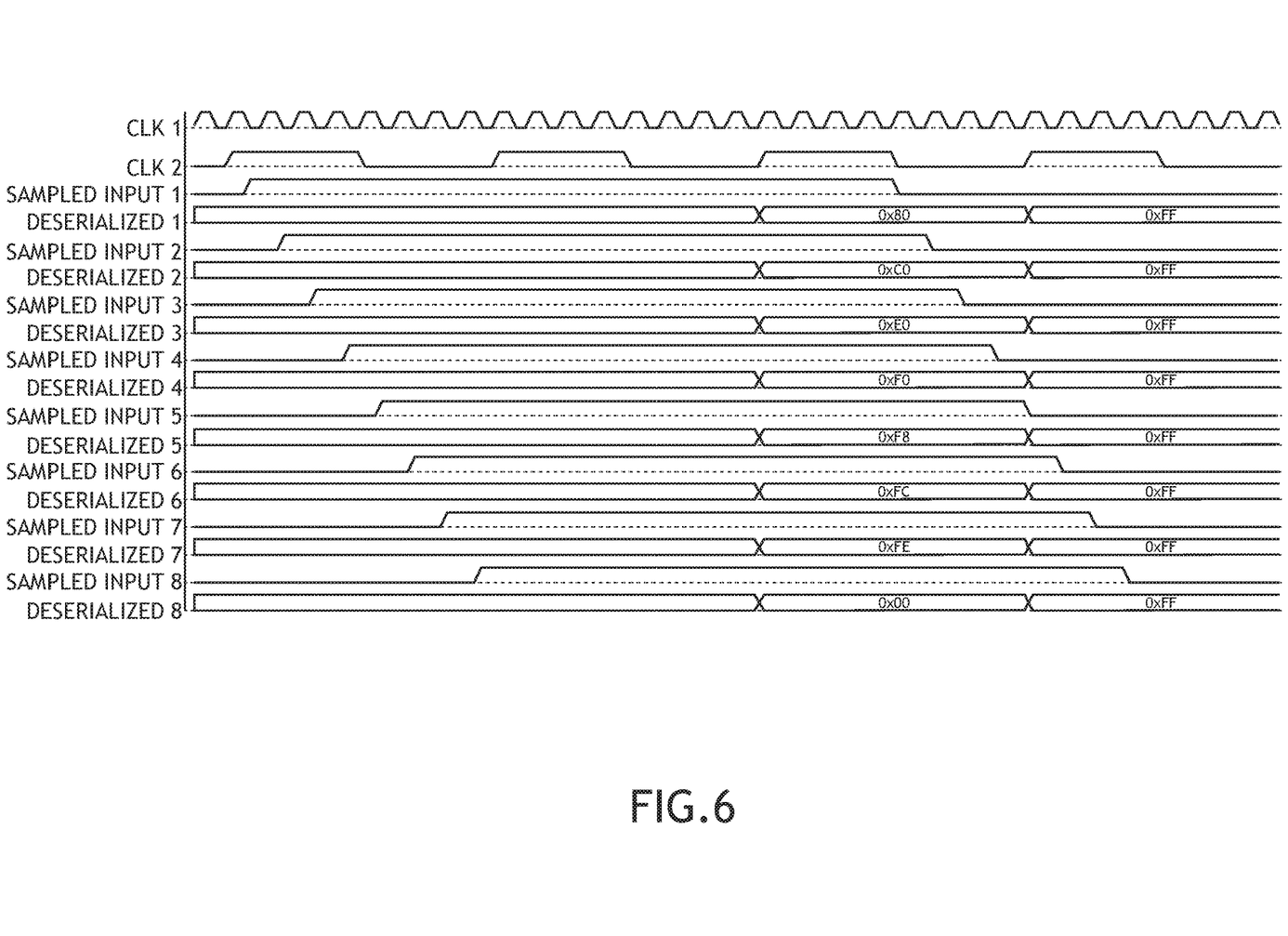
FIG. 6 is an exemplary timing diagram of an exemplary embodiment according to the inventive concepts disclosed herein.

Referring now to FIG. 6, an exemplary timing diagram of an exemplary embodiment according to the inventive concepts disclosed herein is depicted. The input signal arrival time on the high-speed input clock can be inferred from the deserialized output. For example, with the 8:1 deserialization there may be 8 possible clock phases that the input signal could have arrived on.

Figure 7:
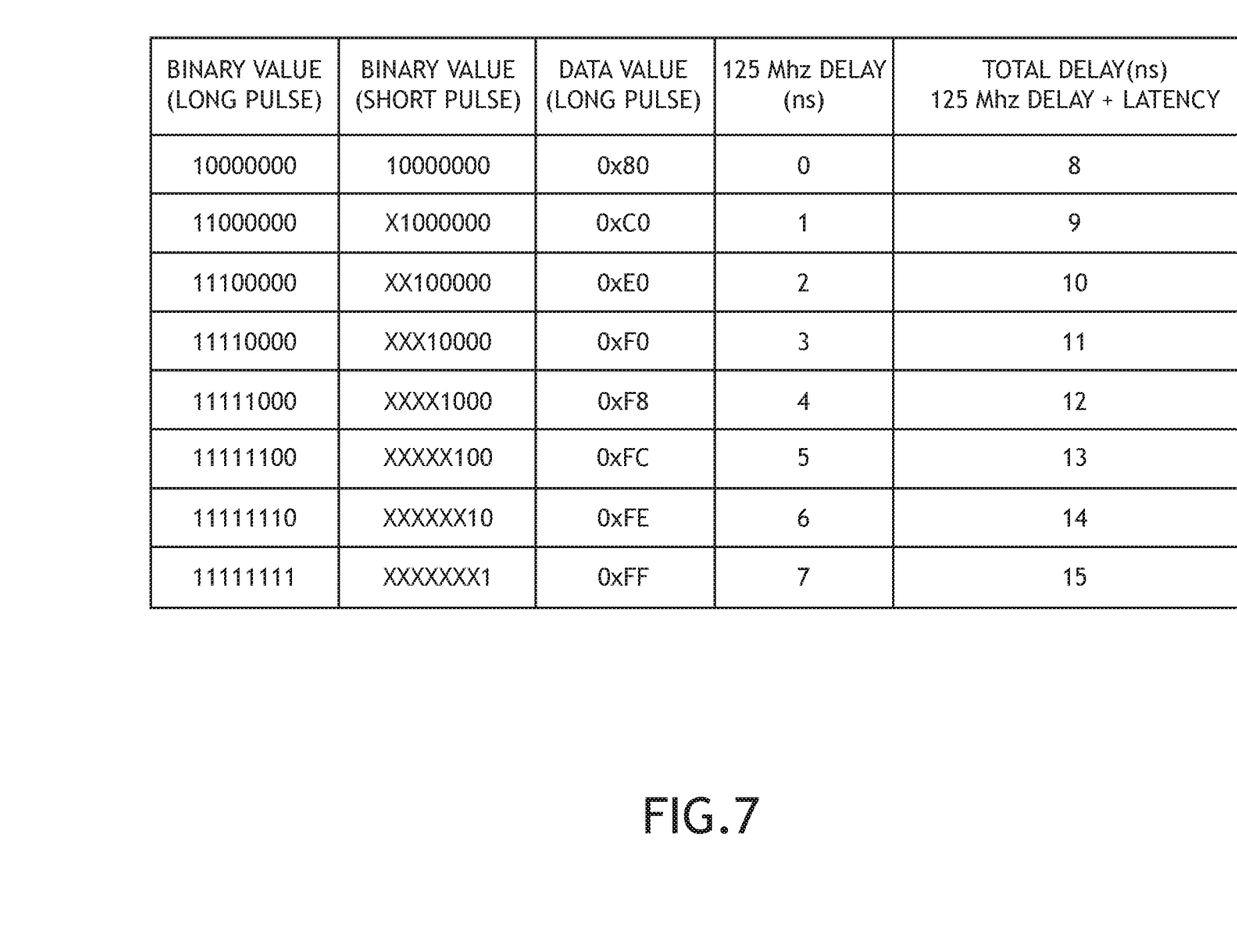
FIG. 7 is an exemplary table of an exemplary embodiment according to the inventive concepts disclosed herein.

Referring now to FIG. 7, an exemplary table of an exemplary embodiment according to the inventive concepts disclosed herein is depicted. For example, assuming an active high input that is going to be active for more than 8 ns, the possible shift register (e.g., deserializer 214) output values are listed in the table. The value to be used may be the first non-zero shift register value since all of the bits can go to steady state of logic one on the following clock. For shorter duration inputs, the values may differ but the position of the first logic 1 in the deserialized output may provide the time of arrival for the input signal. Values for shorter pulses are indicated as well with X signifying a value that is not required for the calculations.

Since the IO deserializers 214 can operate at frequencies greater than 1 GHz for the sample clock the accuracy can be improved to less than 1 ns simply by increasing the clock speed to the maximum allowed by the particular FPGA 104.

If even more accuracy is required, a delayed second clock input can be provided. The delay can be through board traces or phase shifts on the internal FPGA clocking resources. Benefits of adding additional IO may be limited since it is likely that the rise time of the signal results in ambiguities that exceed the accuracy that might be achieved with multiple IO pins.

By utilizing these IO resources in FPGAs 104, two or more independent systems may be synchronized to a single source input signal with sub-nanosecond accuracies. Combined with system knowledge of the synchronization signal routing and GPS location information, other delays can also be included in the timestamping to maintain precision inter-system timing.

Figure 8:
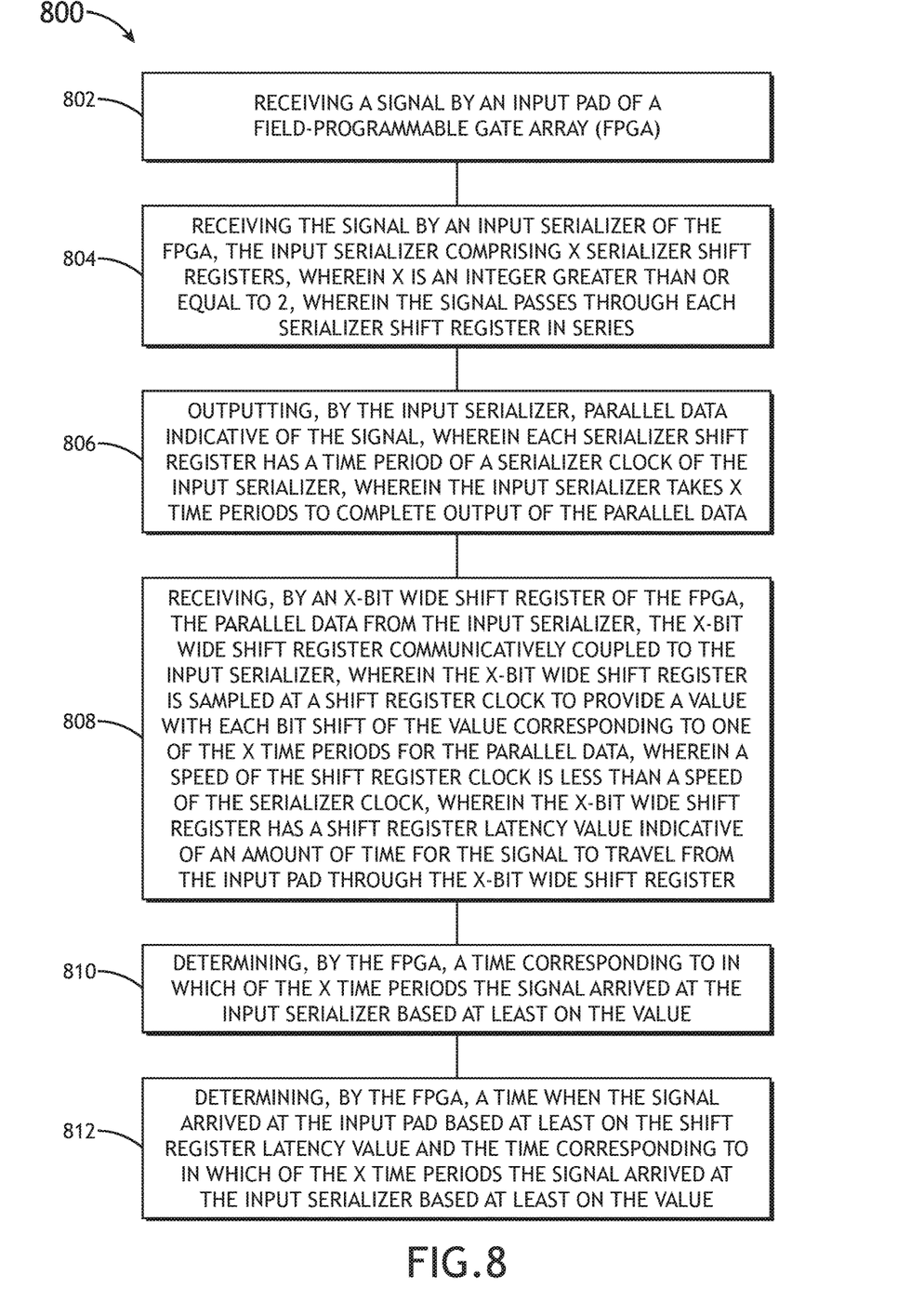
FIG. 8 is a diagram of an exemplary embodiment of a method according to the inventive concepts disclosed herein.

Referring now to FIG. 8, an exemplary embodiment of a method 800 according to the inventive concepts disclosed herein may include one or more of the following steps. Additionally, for example, some embodiments may include performing one more instances of the method 800 iteratively, concurrently, and/or sequentially. Additionally, for example, at least some of the steps of the method 800 may be performed in parallel and/or concurrently. Additionally, in some embodiments, at least some of the steps of the method 800 may be performed non-sequentially.

A step 802 may include receiving a signal by an input pad of a field-programmable gate array (FPGA).

A step 804 may include receiving the signal by an input serializer of the FPGA, the input serializer comprising x serializer shift registers, wherein x is an integer greater than or equal to 2, wherein the signal passes through each serializer shift register in series.

A step 806 may include outputting, by the input serializer, parallel data indicative of the signal, wherein each serializer shift register has a time period of a serializer clock of the input serializer, wherein the input serializer takes x time periods to complete output of the parallel data.

A step 808 may include receiving, by an x-bit wide shift register of the FPGA, the parallel data from the input serializer, the x-bit wide shift register communicatively coupled to the input serializer, wherein the x-bit wide shift register is sampled at a shift register clock to provide a value with each bit shift of the value corresponding to one of the x time periods for the parallel data, wherein a speed of the shift register clock is less than a speed of the serializer clock, wherein the x-bit wide shift register has a shift register latency value indicative of an amount of time for the signal to travel from the input pad through the x-bit wide shift register.

A step 810 may include determining, by the FPGA, a time corresponding to in which of the x time periods the signal arrived at the input serializer based at least on the value.

A step 812 may include determining, by the FPGA, a time when the signal arrived at the input pad based at least on the shift register latency value and the time corresponding to in which of the x time periods the signal arrived at the input serializer based at least on the value.

Further, the method 800 may include any of the operations disclosed throughout.

As will be appreciated from the above, embodiments of the inventive concepts disclosed herein may be directed to a method and a system including an FPGA configured to determine a time when a signal arrived at an input pad of the FPGA.

As used throughout and as would be appreciated by those skilled in the art, "at least one non-transitory computer-readable medium" may refer to as at least one non-transitory computer-readable medium (e.g., e.g., at least one computer-readable medium implemented as hardware; e.g., at least one non-transitory processor-readable medium, at least one memory (e.g., at least one nonvolatile memory, at least one volatile memory, or a combination thereof; e.g., at least one random-access memory, at least one flash memory, at least one read-only memory (ROM) (e.g., at least one electrically erasable programmable read-only memory (EEPROM)), at least one on-processor memory (e.g., at least one on-processor cache, at least one on-processor buffer, at least one on-processor flash memory, at least one on-processor EEPROM, or a combination thereof), or a combination thereof), at least one storage device (e.g., at least one hard-disk drive, at least one tape drive, at least one solid-state drive, at least one flash drive, at least one readable and/or writable disk of at least one optical drive configured to read from and/or write to the at least one readable and/or writable disk, or a combination thereof), or a combination thereof).

As used throughout, "at least one" means one or a plurality of; for example, "at least one" may comprise one, two, three, . . . , one hundred, or more. Similarly, as used throughout, "one or more" means one or a plurality of; for example, "one or more" may comprise one, two, three, . . . , one hundred, or more. Further, as used throughout, "zero or more" means zero, one, or a plurality of; for example, "zero or more" may comprise zero, one, two, three, . . . , one hundred, or more.

In the present disclosure, the methods, operations, and/or functionality disclosed may be implemented as sets of instructions or software readable by a device. Further, it is understood that the specific order or hierarchy of steps in the methods, operations, and/or functionality disclosed are examples of exemplary approaches. Based upon design preferences, it is understood that the specific order or hierarchy of steps in the methods, operations, and/or functionality can be rearranged while remaining within the scope of the inventive concepts disclosed herein. The accompanying claims may present elements of the various steps in a sample order, and are not necessarily meant to be limited to the specific order or hierarchy presented.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed is:

1. A system, comprising:
a field-programmable gate array (FPGA) comprising:
an input pad configured to receive a signal;
an input serializer comprising x serializer shift registers, wherein x is an integer greater than or equal to 2, wherein the input serializer is configured to receive the signal, wherein the signal passes through each serializer shift register in series, wherein the input serializer is configured to output parallel data indicative of the signal, wherein each serializer shift register has a time period of a serializer clock of the input serializer, wherein the input serializer takes x time periods to complete output of the parallel data; and
an x-bit wide shift register communicatively coupled to the input serializer, wherein the x-bit wide shift register is configured to receive the parallel data from the input serializer, wherein the x-bit wide shift register is sampled at a shift register clock to provide a value with each bit shift of the value corresponding to one of the x time periods for the parallel data, wherein a speed of the shift register clock is less than a speed of the serializer clock, wherein the x-bit wide shift register has a shift register latency value indicative of an amount of time for the signal to travel from the input pad through the x-bit wide shift register;

wherein the FPGA is configured to: determine a time corresponding to in which of the x time periods the signal arrived at the input serializer based at least on the value; and determine a time when the signal arrived at the input pad based at least on the shift register latency value and the time corresponding to in which of the x time periods the signal arrived at the input serializer based at least on the value.

2. The system of claim 1, wherein the FPGA is further configured to determine the time corresponding to in which of the x time periods the signal arrived at the input serializer based at least on a position of a first occurrence of an active signal level in the value.

3. The system of claim 1, wherein the time when the signal arrived at the input pad is accurate to within the time period of the serializer clock of the input serializer.

4. The system of claim 1, wherein the FPGA is further configured to timestamp data with the time when the signal arrived at the input pad.

5. The system of claim 1, wherein the FPGA is further configured to utilize the time when the signal arrived at the input pad to perform data alignment.

6. The system of claim 1, wherein the FPGA is further configured to utilize the time when the signal arrived at the input pad to perform clock synchronization operations.

7. The system of claim 1, further comprising a second FPGA, the second FPGA comprising a second input pad, wherein the second FPGA is configured to receive the signal and determine a time when the signal arrived at the second input pad, wherein the FPGA and the second FPGA are configured to be synchronized by utilizing the time when the signal arrived at the input pad and the time when the signal arrived at the second input pad.

8. The system of claim 1, further comprising a first computing device and a second computing device, the first computing device comprising the FPGA, the second computing device comprising a second FPGA, the second FPGA comprising a second input pad, wherein the second FPGA is configured to receive the signal and determine a time when the signal arrived at the second input pad, wherein the FPGA and the second FPGA are configured to be synchronized by utilizing the time when the signal arrived at the input pad and the time when the signal arrived at the second input pad.

9. The system of claim 1, wherein the x-bit wide shift register is a deserializer.

10. The system of claim 1, wherein the parallel data is an x-bit serial data word.

11. The system of claim 1, wherein the signal is a global positioning system (GPS) strobe.

12. The system of claim 1, wherein the signal is a trigger.

13. A method, comprising:
receiving a signal by an input pad of a field-programmable gate array (FPGA);
receiving the signal by an input serializer of the FPGA, the input serializer comprising x serializer shift registers, wherein x is an integer greater than or equal to 2, wherein the signal passes through each serializer shift register in series;
outputting, by the input serializer, parallel data indicative of the signal, wherein each serializer shift register has a time period of a serializer clock of the input serializer, wherein the input serializer takes x time periods to complete output of the parallel data;
receiving, by an x-bit wide shift register of the FPGA, the parallel data from the input serializer, the x-bit wide shift register communicatively coupled to the input serializer, wherein the x-bit wide shift register is sampled at a shift register clock to provide a value with each bit shift of the value corresponding to one of the x time periods for the parallel data, wherein a speed of the shift register clock is less than a speed of the serializer clock, wherein the x-bit wide shift register has a shift register latency value indicative of an amount of time for the signal to travel from the input pad through the x-bit wide shift register;
determining, by the FPGA, a time corresponding to in which of the x time periods the signal arrived at the input serializer based at least on the value; and
determining, by the FPGA, a time when the signal arrived at the input pad based at least on the shift register latency value and the time corresponding to in which of the x time periods the signal arrived at the input serializer based at least on the value.

14. The method of claim 13, wherein the FPGA is further configured to determine the time corresponding to in which of the x time periods the signal arrived at the input serializer based on a position of a first occurrence of an active signal level in the value.

15. The method of claim 13, further comprising at least one of: timestamping, by the FPGA, data with the time when the signal arrived at the input pad; utilizing, by the FPGA, the time when the signal arrived at the input pad to perform data alignment; or utilizing, by the FPGA, the time when the signal arrived at the input pad to perform clock synchronization operations.

* * * * *